United States Patent [19]

Mills et al.

[11] Patent Number: 5,172,117

[45] Date of Patent: Dec. 15, 1992

[54] ANALOG TO DIGITAL CONVERSION USING AN INTEGRATER AND A SAMPLE AND HOLD CIRCUIT

[75] Inventors: James L. Mills; Louis Hlousek, both of Reno, Nev.

[73] Assignee: Linear Instruments, Reno, Nev.

[21] Appl. No.: 367,830

[22] Filed: Jun. 19, 1989

[51] Int. Cl.$^5$ .............................. H03M 1/60
[52] U.S. Cl. .................... 341/157; 341/122; 341/137
[58] Field of Search ............ 341/122, 137, 157; 250/200

[56] References Cited

U.S. PATENT DOCUMENTS

| | | | |
|---|---|---|---|
| 3,447,089 | 5/1969 | Foley | 341/122 X |
| 3,685,043 | 8/1972 | Kosakowski | 341/157 |
| 4,040,041 | 8/1977 | Fletcher et al. | 341/122 X |
| 4,047,187 | 9/1977 | Mashimo et al. | 250/201.2 X |
| 4,329,577 | 5/1982 | Asano et al. | 250/201.2 |
| 4,387,307 | 6/1983 | D'Antonio | 307/119 |
| 4,500,837 | 2/1985 | Shuey et al. | 324/102 |
| 4,546,260 | 10/1985 | Simpson et al. | 250/491.1 |
| 4,640,127 | 2/1987 | Schneider | 73/295 |
| 4,644,523 | 2/1987 | Horwitz | 370/18 |
| 4,672,331 | 6/1987 | Cushing | 341/157 X |
| 4,688,017 | 8/1987 | Huebner et al. | 341/137 |
| 4,751,441 | 6/1988 | Lewis | 318/439 |
| 4,807,147 | 2/1989 | Halbert et al. | 364/487 |
| 4,866,442 | 9/1989 | Stein et al. | 341/143 |
| 4,893,124 | 1/1990 | Tsuji et al. | 341/156 |
| 4,908,620 | 3/1990 | Fujisawa | 341/108 |
| 4,939,516 | 7/1990 | Early | 341/143 |

FOREIGN PATENT DOCUMENTS

| | | | |
|---|---|---|---|
| 0083336 | 6/1980 | Japan | 341/122 |
| 2080059 | 1/1982 | United Kingdom | 341/122 |

Primary Examiner—Benjamin R. Fuller
Assistant Examiner—Randy W. Gibson
Attorney, Agent, or Firm—Killworth, Gottman, Hagan & Schaeff

[57] ABSTRACT

An analog to digital signal converter includes an integrator and a sample and hold circuit. Precisely repeatable timing signals for both the integrator and sample and hold circuit are provided by a microprocessor. The device provides low pass filtering without the phase lag normally associated with linear filters. The device allows one set of data to be acquired while the previous set of data is being digitized. The device is especially applicable to analysis of data generated by a spectrophotometer.

15 Claims, 3 Drawing Sheets

ANALOG TO DIGITAL CONVERSION USING AN INTEGRATER AND A SAMPLE AND HOLD CIRCUIT

BACKGROUND OF INVENTION

1. Field of the Invention

This invention relates to an analog to digital conversion device and method. Specifically, the invention relates to an integrating and sampling and hold circuit for use in digitizing analog signals generated by a spectrophotometer or similar instrument.

2. Description of the Prior Art

Scientific instruments, such as spectrophctometers used for liquid chromatography, typically operate in several different speed modes. A typical spectrophotometer (see FIG. 1) operates in both a high resolution, low speed mode and a low resolution, high speed mode. In both modes, incident light 10 from a broadband light source 11 strikes a rotatable diffraction grating 16. Monochromatic light 17 from the grating 16 then passes through a beam splitter 19 which directs some portion of the light to a reference photodiode 21, and the remaining portion of the light through a sample cell 12 holding a fluid to be analyzed. In the high resolution mode, the rotating optical diffraction grating 16 is brought to a stop in its rotation prior to using the grating 16 to acquire data by photodiode 20. Typically, it takes about 20 miliseconds to rotate the grating 16 to the desired position, and about 20 miliseconds to acquire data in that position. Typically the high resolution mode provides about 24 data points per second. If the user of the instrument is interested in taking measurements at four different wave lengths, wherein each wave length is provided by one position of the grating 16, it is thus possible to take six data points per second on each wave length. In the high speed mode, the diffraction grating 16 is rotated continuously and not stopped at particular positions, and the data is acquired while the grating 16 is rotating. These high speed scans in the high speed mode can be performed repetitively, thus giving the user of the instrument a set of data representing continuous spectra. In the high speed mode, typically about 96 data points per second are taken.

The operation of this instrument presents a disadvantage in the high speed mode in that a large source of noise is introduced into the signal. Light 18 which is diffracted from the grating 16 impinges in the instrument typically on two conventional photodiodes. One photodiode 20 is for light passing through a sample cell 12 which holds the fluid to be analyzed, and the second photodiode 21 is a reference photodiode. The diffracted light 18 creates current in the photodiodes proportional to the light level striking each diode. The current from photodiode 20 is converted to a voltage by means of a conventional current to voltage converter circuit including an operational amplifier 22 and resistor R1. The voltage so produced is then converted to a signal varying in frequency by means of a conventional voltage to frequency (i.e., V/F) converter 24. The number of pulses in the frequency output in a known period of time is counted by a V/F counter 26. The known period of time is determined by an oscillator 25, providing typically a 16 MHz signal, and a counter 28. The V/F converter 24, oscillator 25, counters 26, 28, and controller 30, comprise a conventional ratiometric analog to digital converter. This circuit provides a level of intensity of the light 18 measured digitally.

In order to reduce error when the voltage to frequency converter 24 is operating at low frequencies, the high frequency counter 28 and the V/F counter 26 typically are started and stopped in synchronization with the voltage to frequency pulses output by the voltage to frequency converter 24. A microprocessor 30, which is typically provided in the spectrophotometer, gives a command for an analog to digital conversion operation to take place. At this point, the circuit waits for the next output pulse from the voltage to frequency converter 24, whereupon both the voltage to frequency converter 24 and the high frequency counter 28 start counting down from a preset value. When the high frequency counter 28 has counted down to zero, it resets to its original value, and the two counters 26, 28 then await the next voltage to frequency pulse output by the voltage to frequency converter 24, whereupon both counter 26 and counter 28 are stopped. The number of V/F pulses and high frequency pulses are then determined. The ratio of the number of V/F pulses to the number of high frequency pulses provides a number which is proportional to the amount of light impinging on a photodiode.

With the above-described analog to digital conversion process, the time of data acquisition can vary greatly in terms of both the starting time and ending time. In essence the starting time and ending time are defined by the time spent waiting for the next voltage to frequency pulse output by the voltage to frequency converter 24. This variance, or jitter, in the time of data acquisition disadvantageously creates inaccuracies when the diffraction grating 16 is rotating rapidly as it does in the high speed mode because there is a large background absorbance which varies significantly as a function of spectrophotometer wavelength, or grating position. This inaccuracy manifests itself as noise, as the background absorbance shifts from one scan to the next. In the high resolution mode, this is usually not a problem, because the grating is held stationary during the entire A/D process, including the jitter.

SUMMARY OF THE INVENTION

In accordance with the invention, a circuit is provided to provide precisely repeatable data acquisiticn times for an analog to digital converter. In accordance with the preferred embodiment of the invention, an integrating sample and hold circuit is provided for this purpose. The timing signals for the integrating sample and hold circuit are preferably generated by a control microprocessor, using a high priority non-maskable interrupt. The maximum jitter in such a circuit is the execution time of one instruction by the microprocessor, i.e., generally less than about 3 microseconds, thus ensuring precisely repeatable timing signals.

At the start of each sample and hold cycle, an integrator, which includes an operational amplifier and a feedback capacitor, is discharged. The voltage of the integrating operational amplifier then ramps up at a rate proportional to the input voltage. Since the time of integration is precisely controlled, the voltage at the end of the sample and hold cycle is proportional to the time average of the input voltage to the integrating operational amplifier. This provides low pass filtering without the phase lag normally associated with conventional linear filters. At the end of the sample and hold cycle, the voltage in the integrating operational amplifier is transferred to a sample and hold circuit. This present invention has the advantage therefore of allowing one set of data to be acquired while the previous set of data is being digitized. Thus, a data acquisition duty cycle of nearly 100% is possible, i.e., data may be acquired continually.

The present invention provides another advantage that the noise level is largely independent of wavelength, thus the analog to digital conversion timing no longer has any effect on the level of noise.

The present invention is not limited to applications involving analog to digital conversion of signals from a spectrophotometer but is applicable to other sorts of analog to digital conversions.

DETAILED DESCRIPTION OF THE INVENTION

Figure 2:
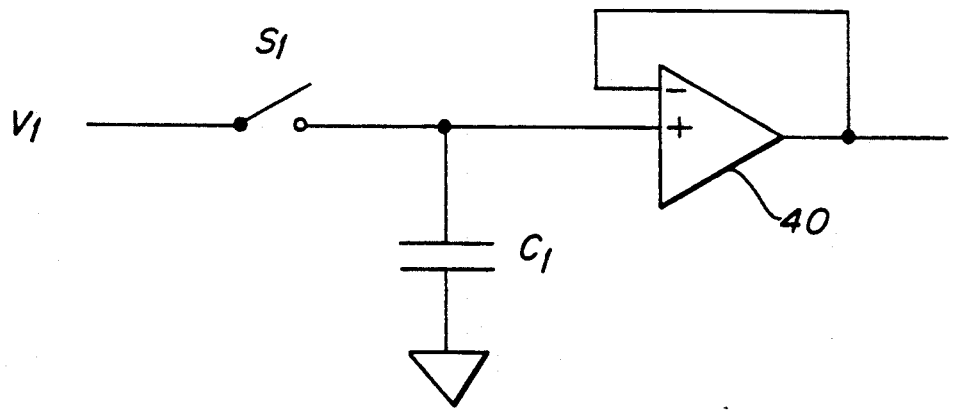
FIG. 2 shows a prior art sample and hold circuit.

In accordance with the invention, an integrating sample and hold circuit is used for analog to digital conversion of signals. A conventional sample and hold circuit (without integration) is shown in FIG. 2. With the electronic switch S1 of the circuit closed, the input voltage V1 charges the capacitor C1. When switch S1 is open, the extremely high input impedance of the operational amplifier 40 (i.e., a voltage follower) causes the charge to be held on the capacitor C1 without appreciable decay for at least the time interval required for conversion. After conversion to a digital signal (not shown), the digital signal is transferred typically to a counter, which delivers the count to a computer.

In accordance with the invention, such a sample and hold circuit is used in combination with an integrator. The precise control of the duration of integration ensures that the voltage at the end of the sample and hold cycle is proportional to the time average of the input voltage to the integrator.

Figure 3:
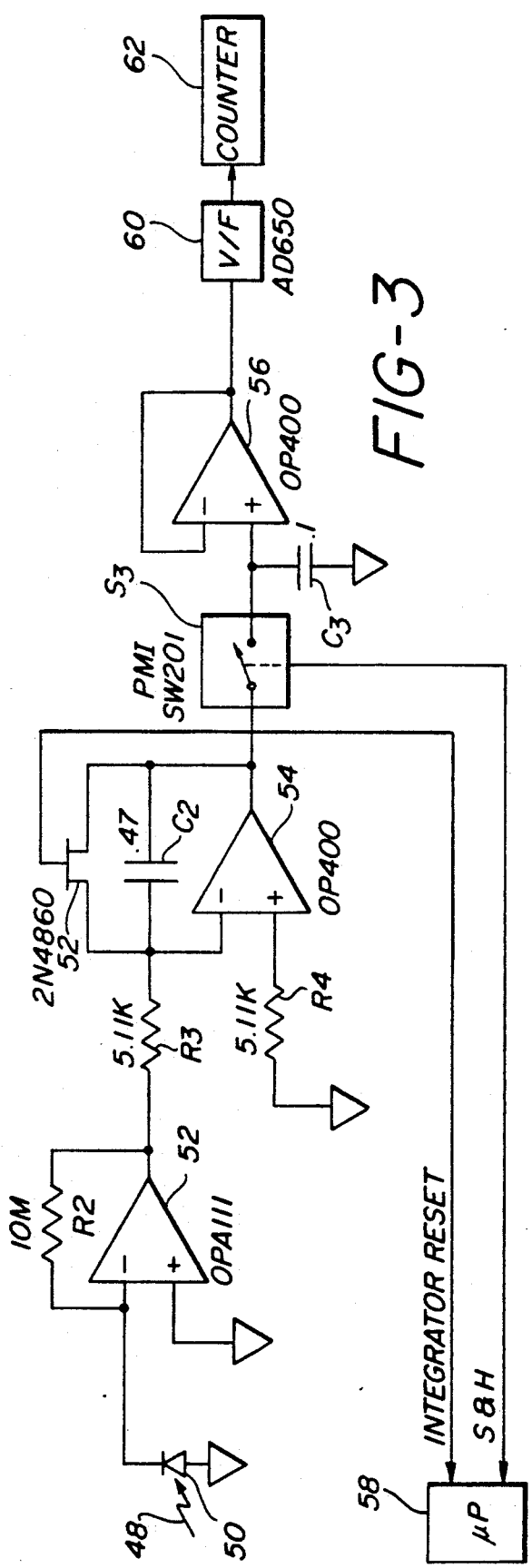
FIG. 3 shows an analog to digital conversion circuit in accordance with the invention.

FIG. 3 shows a circuit in accordance with the preferred embodiment of the invention. Light 48 typically transmitted from a monochromator (not shown) through a sample cell (not shown) impinges upon a photodiode 50. Photodiode 50 outputs an electric current (i.e., a signal) proportional to the intensity of the light impinging on photodiode 50. This electric current is received by operational amplifier 52 across which is connected resistor R2. Operational amplifier 52 converts the level of current output by the photodiode 50 to a voltage level and so is a current to voltage converter.

The voltage from operational amplifier 52 is then provided by means of resistor R3 to the integrating operational amplifier 54. Operational amplifier 54 operates as an integrator to capacitor C2 attached between its output and inverting input, and operational amplifier 54 also has its non-inverting input grounded by resistor R4. Capacitor C2 may be discharged by closure of an electronic switch S2, i.e., a field effect transistor or similar device. Switch S2 is controlled by a signal called the integrator reset signal, which is provided by microprocessor 58. The output of integrating operational amplifier 54 is provided to a sample and hold circuit which conventionally includes as described above an electronic switch S3, a capacitor C3, and an operational amplifier 56 the output of which is provided to its inverting input. The electronic switch S3 which charges capacitor C3 is controlled by a signal called the sample and hold signal which is provided by a microprocessor 58.

The microprocessor 58 thus provides a timing control function to periodically generate the integrator reset and sample and hold signals. Typically, the microprocessor 58 provides a very accurately timed (i.e., control) signal, preferably with a jitter time, i.e., variance, of less than 3 microseconds which is the typical execution time of one instruction in a microprocessor. In the preferred embodiment of the invention, the microprocessor 58 is a Motorola 6809, and the control signals are conventionally generated from a peripheral interface adapter, the commercially available Motorola 6821. The sample and hold electronic switch S3 is triggered by a second timing signal also provided by the microprocessor 58 as described above. When the electronic switch S3 is closed by the sample and hold signal, this action provides the output of the integrating operational amplifier 54 to operational amplifier 56. The sampled and held signal which is the output of operational amplifier 56 is provided to the voltage to frequency converter 60. Voltage to frequency converter 60 then conventionally provides an output to the counter 62.

Figure 4:
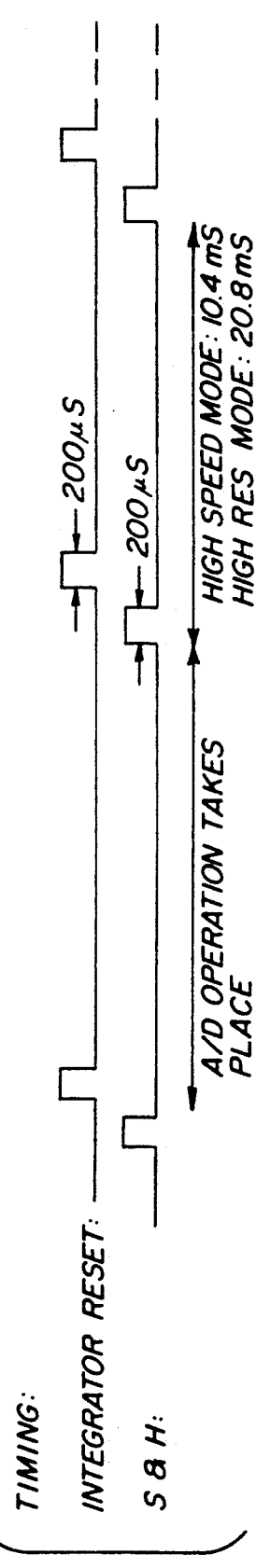
FIG. 4 shows a timing diagram for the circuit of FIG. 3.

FIG. 4 shows a timing diagram for the integrator reset and sample and hold signals as provided by the microprocessor. As shown across the bottom of FIG. 4, the analog to digital conversion operation takes place between the time of the provision of consecutive sample and hold (i.e., "S&H") signals. The duration of both the integrator reset signal and sample and hold signal is, in the preferred embodiment, approximately 200 microseconds. Both the integrator reset signal and the sample and hold signal are generated by conventional nonmaskable interrupts (i.e., high priority instructions conventionally) provided in the control program in the microprocessor 58. During the analog to digital conversion of the previous data point, the integrating operational amplifier 54 charges up for a period of time shown as being preferably approximately 10.4 milliseconds in the high speed mode and approximately 20.8 milliseconds in the high resolution mode.

In the preferred embodiment, the following components are used in the circuit shown in FIG. 3. The operational amplifier 52 which converts the current to voltage is an OPA111 operational amplifier commercially provided by Burr-Brown. Resistor R2 is 10 megohms, and resistors R3 and R4 are 5.11 rilohms each. Field effect transistor S2 is a 2N4860 transistor. The capacitor C2 is 0.47 microfarads. Operational amplifiers 54 and 56 are both OP400 operational amplifiers commercially provided by PMI. The sample and hold electronic switch S3 is a PMI switch SW201. The capacitor C3 connected to the sample and hold switch is 0.1 microfarads. The voltage to frequency converter 60 is an AD650 circuit, commercially available from Analog Devices. Counter 62 is any suitable counter. Preferably a Motorola 6840 programmable timer module is used together with an 8 bit counter such as a 74LS393 counter as counter 62. The Motorola 6840 provides the oscillator signal, counts the V/F pulses and the high order (most significant bits) oscillator count, and the 74LS393 performs the low order (least significant bits) oscillator count.

Figure 1:
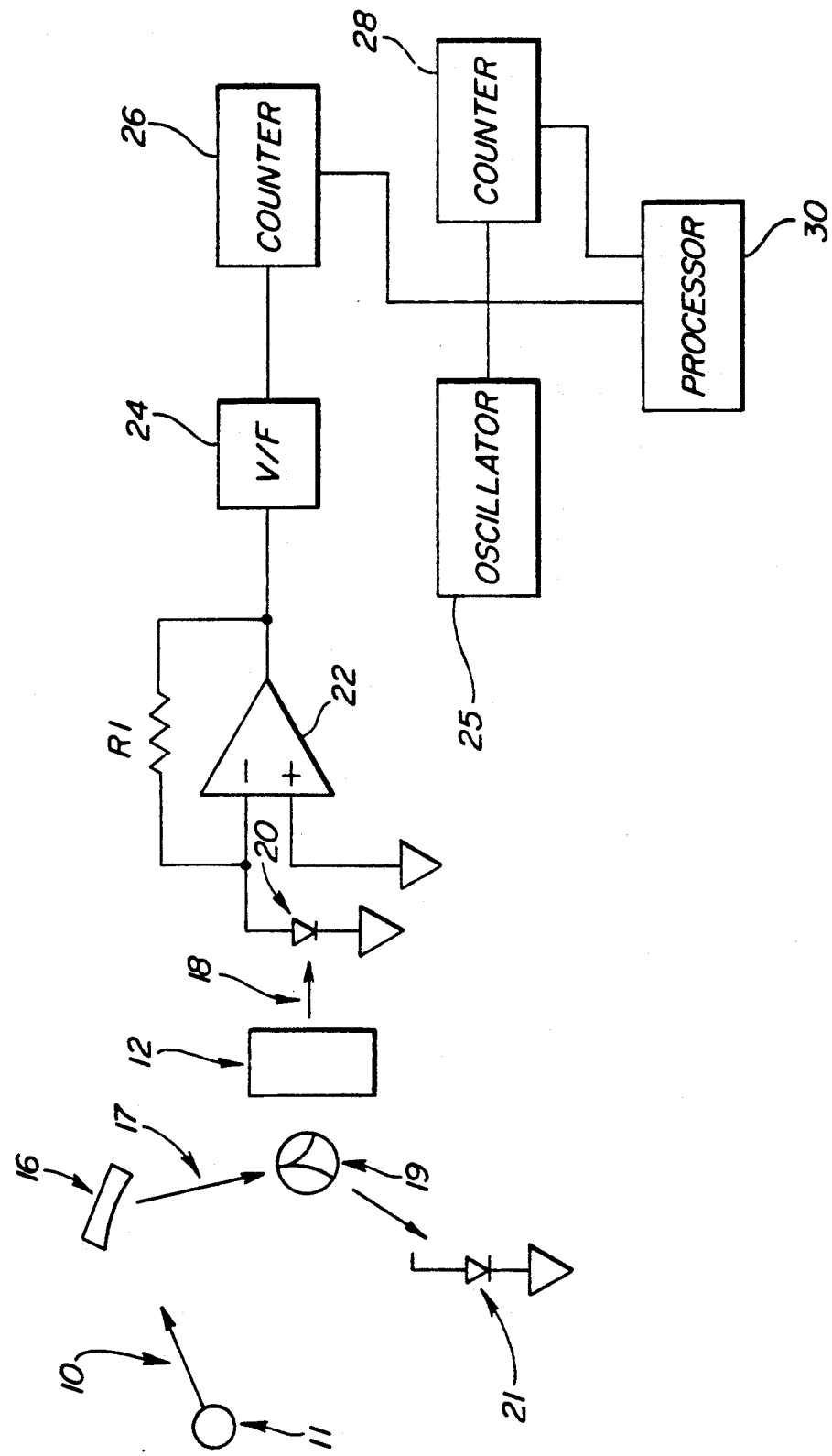
FIG. 1 shows a prior art analog to digital conversion circuit.

In accordance with one embodiment of the invention, the operational amplifier 52 is physically located immediately adjacent to the photodiodes, rather than on a circuit board with the rest of the processing circuitry. This improves signal pickup and reduces noise. It will also be appreciated that in accordance with the above description of the invention, there are preferably two such analog to digital circuits provided, one for the photodiode 50 which receives light from a sample and one for a second photodiode which serves as a reference photodiode as shown in FIG. 1.

The above-description of the invention is illustrative and not limiting. The invention is not limited to spectrophotometers or to light signals as input or to scientific instrumentation. Further embodiments of the invention will be apparent in light of the invention to one of ordinary skill in the art.

We claim:

1. A device for converting an analog signal to a digital signal comprising:
   integrating means for integrating the analog signal substantially continually;
   sample and hold means for sampling and holding an output of the integrating means;
   control means for providing a plurality of control signals at predetermined time intervals to the integrating means and to the sample and hold means;
   a voltage to frequency converter for receiving an output of the sample and hold means and converting the output of the sample and hold means to a digital signal having a frequency which is a function of a voltage of the output of the sample and hold means and representative of the analog signal; and
   a counter for counting the frequency of the digital signal of the voltage to frequency converter.

2. The device of claim 1 wherein the integrating means comprises an operational amplifier.

3. The device of claim 1 wherein the control means comprises a microprocessor.

4. The device of claim 1 wherein the analog signal is provided by a photodiode.

5. The device of claim 1 wherein the analog signal is provided by a current to voltage converter.

6. The device of claim 1 wherein the device operates in a first mode at a predetermined rate and a second mode at a second predetermined rate, the mode being determined by the control means.

7. A method for converting an analog signal to a digital signal comprising the steps of:
   integrating the analog signal substantially continually;
   sampling and holding the integrated analog signal;
   converting the sampled and held signal to a frequency varying signal which is a digital representative of the analog signal; and
   counting a frequency output of said frequency varying signal.

8. The method of claim 7 further comprising a step of controlling the step of integrating and the step of sampling and holding.

9. The method of claim 8 wherein the step of controlling is performed at at least two predetermined rates.

10. The device of claim 3, wherein the microprocessor is adapted to periodically reset the integrating means with a jitter time of not more than about an execution time of one instruction in the microprocessor.

11. The device of claim 3, wherein the microprocessor is adapted to periodically generate a sample and hold signal to the sample and hold means with a jitter time of not more than about an execution time of one instruction in the microprocessor.

12. The device of claim 11, further comprising a converter for analog to digital conversion of a signal held by said sample and hold means, wherein the analog to digital convertion takes place between two consecutive sample and hold signals.

13. The device of claim 3, wherein the microprocessor is adapted to generate the control signals using a high priority non-maskable interrupt.

14. The device of claim 1, wherein the analog signal is provided by a photosensor.

15. A circuit for converting an analog current derived from a photosensor to a digital signal comprising:
   a current to voltage converter for converting the analog current derived from the photosensor to a first voltage substantially continually;
   an integrator for integrating the first voltage substantially continually and providing an integrated voltage, the integrator being rest in response to a first signal;
   a sample and hold circuit for sampling and holding the integrated voltage in response to a second signal;
   a converter for analog to digital conversion of a voltage held by the sample and hold circuit to a frequency varying signal, the frequency varying signal being a digital representative of the analog current;
   a counter for counting a frequency of the frequency varying signal produced by the converter; and
   a processor for generating first signals to the integrator at predetermined intervals of time and second signals to the sample and hold circuit at predetermined intervals of time.

* * * * *